US009897266B2

United States Patent
Moon et al.

(10) Patent No.: US 9,897,266 B2
(45) Date of Patent: Feb. 20, 2018

(54) LIGHT SOURCE MODULE AND LIGHTING APPARATUS INCLUDING THE SAME

(71) Applicant: Samsung Electronics Co., Ltd., Suwon-si, Gyeonggi-do (KR)

(72) Inventors: Kyung Mi Moon, Suwon-si (KR); Sang Woo Ha, Seongnam-si (KR); Jong Sup Song, Hwaseong-si (KR); Tetsuo Ariyoshi, Suwon-si (KR); Jun Cho, Yongin-si (KR); Won Soo Ji, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/280,253

(22) Filed: Sep. 29, 2016

(65) Prior Publication Data
US 2017/0261161 A1    Sep. 14, 2017

(30) Foreign Application Priority Data

Mar. 11, 2016    (KR) ........................ 10-2016-0029453

(51) Int. Cl.
| | |
|---|---|
| *F21K 9/61* | (2016.01) |
| *F21V 29/77* | (2015.01) |
| *F21V 15/015* | (2006.01) |
| *F21K 9/27* | (2016.01) |
| *F21V 9/00* | (2018.01) |
| *F21V 3/02* | (2006.01) |
| *H01L 33/60* | (2010.01) |
| *H01L 33/48* | (2010.01) |
| *F21Y 115/10* | (2016.01) |
| *F21Y 103/10* | (2016.01) |

(52) U.S. Cl.
CPC .................. *F21K 9/61* (2016.08); *F21K 9/27* (2016.08); *F21V 3/02* (2013.01); *F21V 9/00* (2013.01); *F21V 15/015* (2013.01); *F21V 29/77* (2015.01); *H01L 33/486* (2013.01); *H01L 33/60* (2013.01); *F21Y 2103/10* (2016.08); *F21Y 2115/10* (2016.08)

(58) Field of Classification Search
CPC .... F21Y 2103/10; F21Y 2115/10; F21K 9/61; F21K 9/27; F21V 29/77; F21V 3/02; F21V 9/00; F21V 15/015; H01L 33/486; H01L 33/60
USPC .............................. 362/235, 293, 97.1–97.4
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| KR | 101225603 B1 | 1/2013 |
| KR | 101484466 B1 | 1/2015 |
| KR | 20150095415 A | 8/2015 |

*Primary Examiner* — Laura Tso
(74) *Attorney, Agent, or Firm* — Harness, Dickey & Pierce, P.L.C.

(57) ABSTRACT

A light source module includes a light source, a light guide plate on the light source and including at least one recess portion in an upper surface thereof, and a filter sheet on an upper surface of the light guide plate and having a pattern. The pattern may be configured to partially reflect and partially transmit light emitted from the light source through the light guide plate.

20 Claims, 8 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,287,891 B1 | 10/2007 | Park et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,654,687 B2 | 2/2010 | Tsai et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,408,738 B2 | 4/2013 | Kim et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,641,219 B1 * | 2/2014 | Johnson ............... G02B 6/0021 362/97.3 |
| 8,675,149 B2 | 3/2014 | Jung et al. |
| 8,727,598 B2 * | 5/2014 | Ohshima ........... G02F 1/133603 349/58 |
| 8,735,931 B2 | 5/2014 | Han et al. |
| 8,766,295 B2 | 7/2014 | Kim |
| 8,840,276 B2 | 9/2014 | Shani et al. |
| 9,121,981 B2 | 9/2015 | Kim et al. |
| 9,133,988 B2 | 9/2015 | Coleiny |
| 9,170,360 B2 | 10/2015 | Watabe et al. |
| 2012/0020080 A1 * | 1/2012 | Sato ...................... H01H 13/83 362/235 |
| 2012/0162966 A1 * | 6/2012 | Kim .................. G02F 1/133606 362/97.1 |
| 2015/0177439 A1 | 6/2015 | Durkee et al. |

* cited by examiner

LIGHT SOURCE MODULE AND LIGHTING APPARATUS INCLUDING THE SAME

CROSS-REFERENCE TO RELATED APPLICATIONS

This application claims benefit of priority to Korean Patent Application No. 10-2016-0029453 filed on Mar. 11, 2016 in the Korean Intellectual Property Office, the disclosure of which is incorporated herein by reference in its entirety.

BACKGROUND

1. Field

The present inventive concepts relate to a light source module and a lighting apparatus including the same.

2. Description of Related Art

Semiconductor light emitting diode (LED) elements have been used as light sources in various types of electronic products such as television sets, mobile phones, personal computers, notebook computers, personal digital assistants (PDAs), and the like, as well as for light sources of lighting apparatuses.

However, in a case in which LED elements are used as surface light sources, due to light characteristics thereof, such as high linearity, hot spots may occur due to non-uniform brightness distribution. In order to limit and/or prevent the occurrence of such hot spots, a distance between an LED element and a diffusion plate needs to be increased. Thus, the sizes and thicknesses of lighting apparatuses are increased.

SUMMARY

An aspect of the present inventive concepts is to provide a scheme in which the occurrence of non-uniform areas of brightness such as hot spots may be limited and/or prevented while allowing for the slimming of a lighting apparatus.

According to some example embodiments of the present inventive concepts, a light source module may include a light source, a light guide plate on the light source, the light guide plate including an upper surface, the light guide plate including a recess portion in the upper surface of the light guide plate, and a filter sheet attached to the upper surface of the light guide plate, the filter sheet including a pattern configured to partially reflect and partially transmit light emitted from the light source through the light guide plate.

According some example embodiments of the present inventive concepts, a light source module may include a plurality of light sources; a light guide plate including a first surface proximate to the plurality of light sources, a second surface opposing the first surface, and a third surface between the first surface and the second surface; and a filter sheet attached to an upper surface of the light guide plate. The light guide plate may include a plurality of recess portions recessed into the second surface and disposed in regions of the second surface corresponding to positions of the plurality of light sources. The filter sheet may include a plurality of patterns covering separate, respective recess portions of the light guide plate, and the filter sheet may be configured to partially reflect and partially transmit light emitted from the plurality of light sources through the light guide plate.

According to some example embodiments of the present inventive concepts, a lighting apparatus may include a light source module, and a cover disposed above the light source module. The light source module may include a light source; a light guide plate on the light source and including a recess portion formed in an upper surface of the light guide plate; and a filter sheet attached to the upper surface of the light guide plate and including a pattern configured to partially reflect and partially transmit light emitted from the light source through the light guide plate.

According to some example embodiments of the present inventive concepts, an apparatus may include a plurality of light sources, a light guide plate on the plurality of light sources, and a filter sheet on an upper surface of the light guide plate. The light guide plate may include a first surface proximate to the plurality of light sources, a second surface distal to the plurality of light sources, and a third surface between the first surface and the second surface. The light guide plate may include a plurality of recess portions recessed into the second surface, the recess portions vertically aligned with separate, respective light sources of the plurality of light sources. The filter sheet may include a plurality of patterns vertically aligned with separate, respective recess portions of the light guide plate. Each pattern of the plurality of patterns may include at least one of a radial pattern of dots, each dot of the radial pattern of dots including a reflective material, and a radial pattern of holes, each hole of the radial pattern of holes configured to expose at least a portion of the second surface of the light guide plate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, example embodiments of the present inventive concepts will be described with reference to the accompanying drawings.

Figure 1:
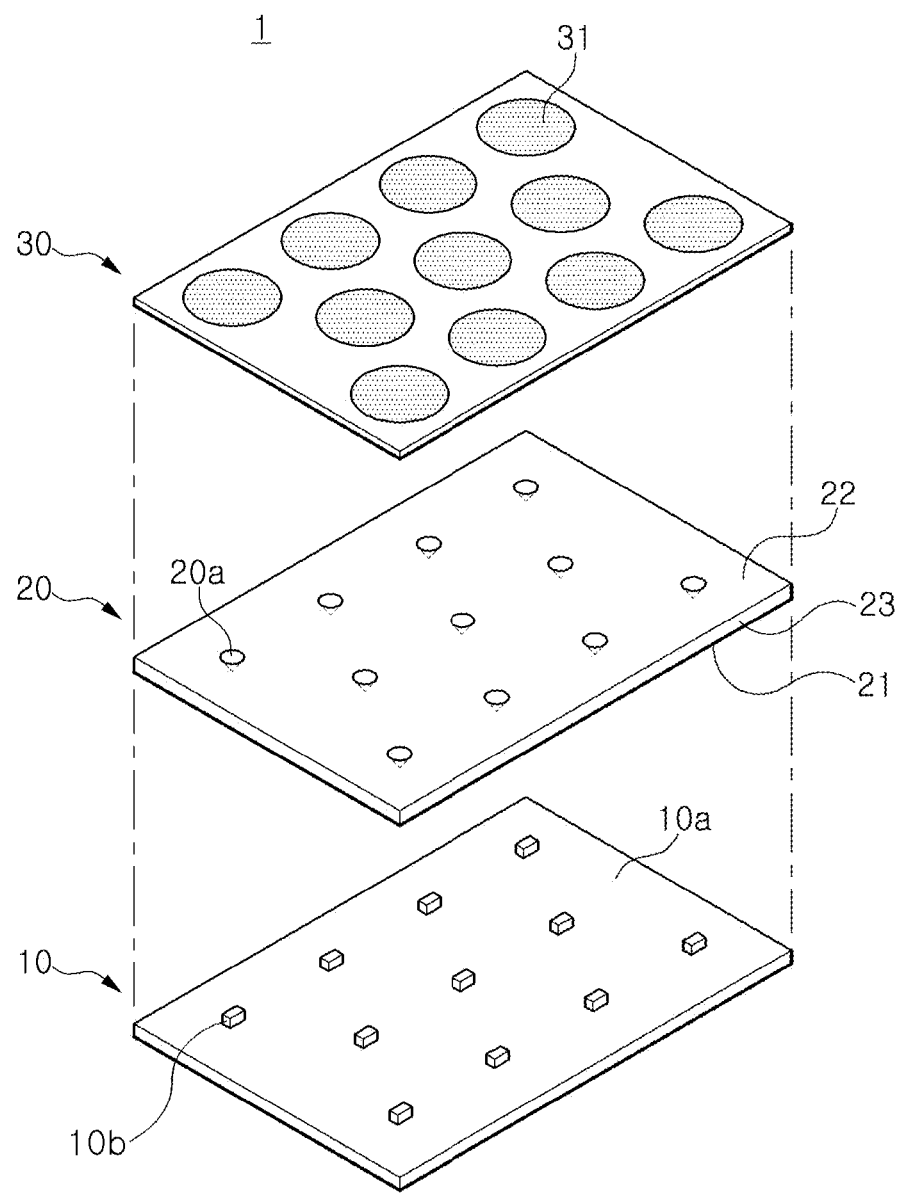
FIG. 1 is an exploded perspective view of a light source module according to some example embodiments.
Figure 2:
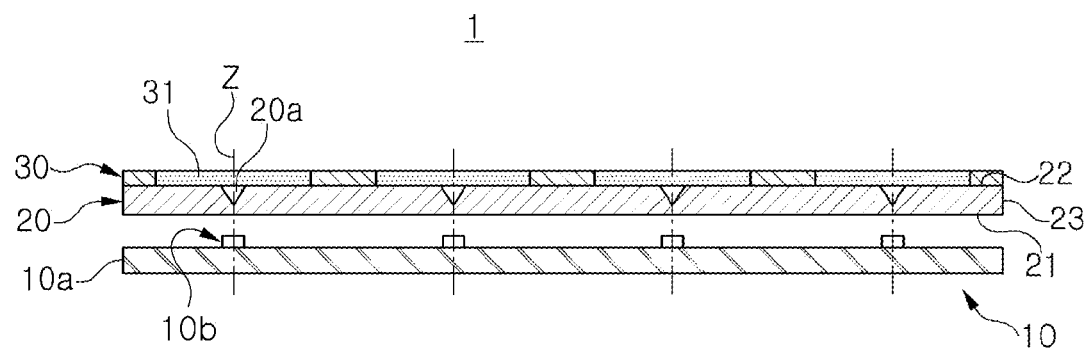
FIG. 2 is a schematic cross sectional view of the light source module of FIG. 1.
Figure 3:
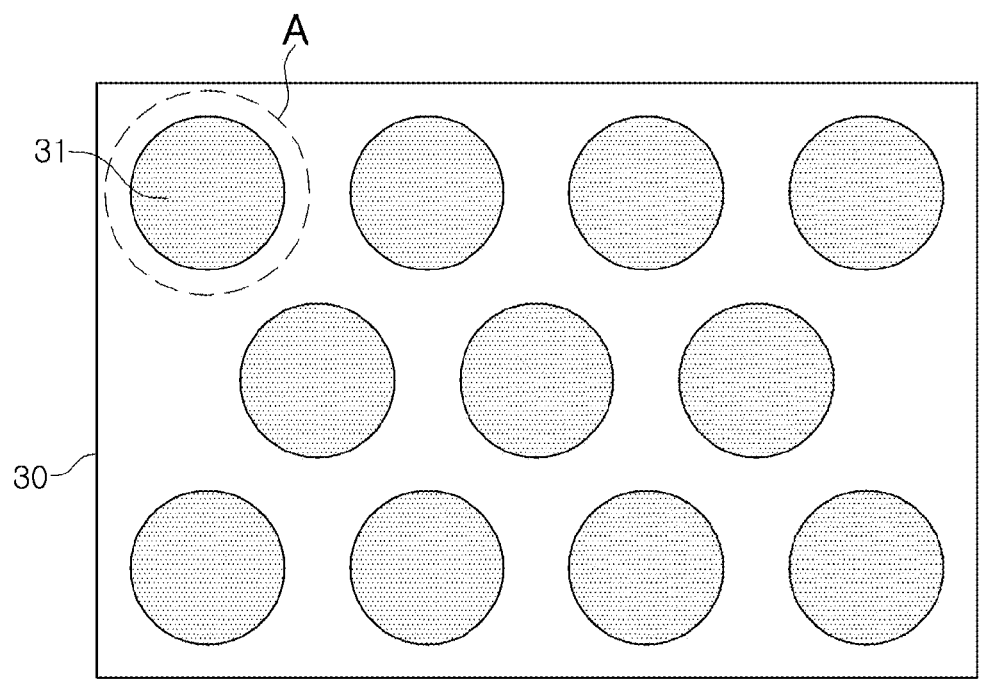
FIG. 3 is a plan view of FIG. 2.

With reference to FIGS. 1 to 3, a light source module according to some example embodiments will be described. FIG. 1 is an exploded perspective view of a light source module according to some example embodiments, FIG. 2 is a schematic cross-sectional view of the light source module of FIG. 1, and FIG. 3 is a plan view of FIG. 2.

With reference to FIGS. 1 to 3, a light source module 1 according to some example embodiments may include a light source layer 10, a light guide plate 20 on the light source layer 10, and a filter sheet 30 attached to an upper surface of the light guide plate 20.

The light source layer 10 may include one or more light sources 10b. A light source 10b may be an optoelectronic device configured to generate light having a desired (and/or alternatively predetermined) wavelength based on driving power applied to the light source 10b from an external source. For example, the light source 10b may include a light emitting diode (LED) including an n-type semiconductor layer, a p-type semiconductor layer, and an active layer disposed therebetween.

The light source 10b may emit blue light, green light, or red light, and may also emit ultraviolet light or the like. The light source 10 may emit white light through a wavelength conversion material such as a phosphor, so that the wavelength of light propagating from the light source 10b through the wavelength conversion material and emitted from the wavelength conversion material is in a wavelength range associated with a particular color.

The light source 10b may be mounted on a substrate 10a to be electrically connected thereto. In the case of the light source layer 10 shown in FIGS. 1-3, a plurality of light sources 10b may be arranged on the substrate 10a in transversal and longitudinal directions.

The substrate 10a may be a printed circuit board. For example, the substrate 10a may be an FR4-type printed circuit board (PCB) or a flexible PCB capable of being easily flexed. Such a printed circuit board may be formed of an organic resin material containing an epoxy, triazine, silicone, polyimide, and the like, and other organic resin materials, may be formed of a ceramic material such as silicon nitride, AlN, Al2O3, or the like, or may be formed of a metal and a metal compound such as a material of a metal core printed circuit board (MCPCB), a metal copper clad laminate (MCCL), or the like.

The light guide plate 20 may be disposed on the light source layer 10 in a form covering the one or more light sources 10b of the light source layer 10. The light guide plate 20 may include a first surface 21 facing the light source layer 10 (e.g., proximate to the light source layer 10), a second surface 22 opposing the first surface 21 (e.g., distal to the light source layer 10), and a third surface 23 provided between the first surface 21 and the second surface 22.

The first surface 21 may be a bottom surface of the light guide plate 20. Light from the one or more light sources 10b of the light source layer 10 may be transmitted to the interior of the light guide plate 20 through the first surface 21. The second surface 22 may be an upper surface of the light guide plate 20. The light having been transmitted into the light guide plate 20 may be externally emitted through the second surface 22. The third surface 23 may be a lateral surface of the light guide plate 20. The third surface 23 may connect an edge of the first surface 21 and an edge of the second surface 22 to each other.

The light guide plate 20 may have a recess portion 20a formed in the second surface 22, and the second surface 22 may be referred to herein as an upper surface of the light guide plate 20. The recess portion 20a may have a structure recessed into the second surface 22, toward the light source layer 10, to a desired (and/or alternatively predetermined) depth. The structure of the recess portion 20a may include, for example, a conical shaped structure, a triangular pyramid shaped structure, a quadrangular pyramid shaped structure, some combination thereof, or the like.

As shown in FIGS. 1-3, the recess portion 20a may be disposed to oppose the light source layer 10 (e.g., the recess portion 20a may extend into the light guide plate 20 interior from a distal surface in relation to the light source layer 10), and a vertex of the recess portion 20a may be recessed toward the light source 10 may be aligned with an axis Z of the light source 10. In the case of the recess portion 20a, the number (e.g., quantity) of the recess portions 20a of the light guide plate 20 may correspond to, at least, the number (e.g., quantity) of light sources 10b of the light source layer 10.

The recess portion 20a may refract and reflect light from the light source 10, in such a manner that the light emitted by a corresponding light source 10b may be widely diffused in a lateral direction with respect to the axis Z, along the interior of the light guide plate 20. Thus, light emitted from the light source 10 may be limited and/or prevented from being concentrated on an upper portion of the light source 10, to thus relieve or limit and/or prevent the occurrence of hot spots due to non-uniform brightness distribution.

The light guide plate 20 may be formed of (e.g., at least partially comprise) a light transmitting material. Examples of a material of the light guide plate 20 may include polycarbonate (PC), polymethyl methacrylate (PMMA), acryl, a resin, and the like. The light guide plate 20 may also be formed of a glass material, but is not limited thereto.

The light guide plate 20 may have a thickness within a range of about 2 mm to about 5 mm. As such, as the light guide plate 20 is relatively thin, the slimming of the entirety of the light source module 1 may be implemented.

The filter sheet 30 may be attached to the second surface 22 of the light guide plate 20 to cover an upper surface of the light guide plate 20. The filter sheet 30 may be attached to the light guide plate 20 in a thin form, or may be formed by being printed through a printing method such as screen printing to cover an upper surface of the light guide plate 20. The filter sheet 30 may be formed of light transmitting material.

The filter sheet 30 may have a pattern 31 that is configured to allow light emitted from the light source 10 to be partially transmitted and reflected.

The pattern 31 may be disposed on the recess portion 20a to cover the recess portion 20a. The pattern 31 has a greater size than an area of the recess portion 20a exposed to the second surface 22, to cover a desired (and/or alternatively predetermined) region in the vicinity of the recess portion 20a, as well as the recess portion 20a.

In some example embodiments, including the example embodiments illustrated in FIGS. 1-3, the pattern 31 has a substantially circular shape. For example, the pattern 31 may have various shapes such as a triangular shape, a quadrangular shape, a hexagonal shape, an octagonal shape, and the like.

Figure 4A:
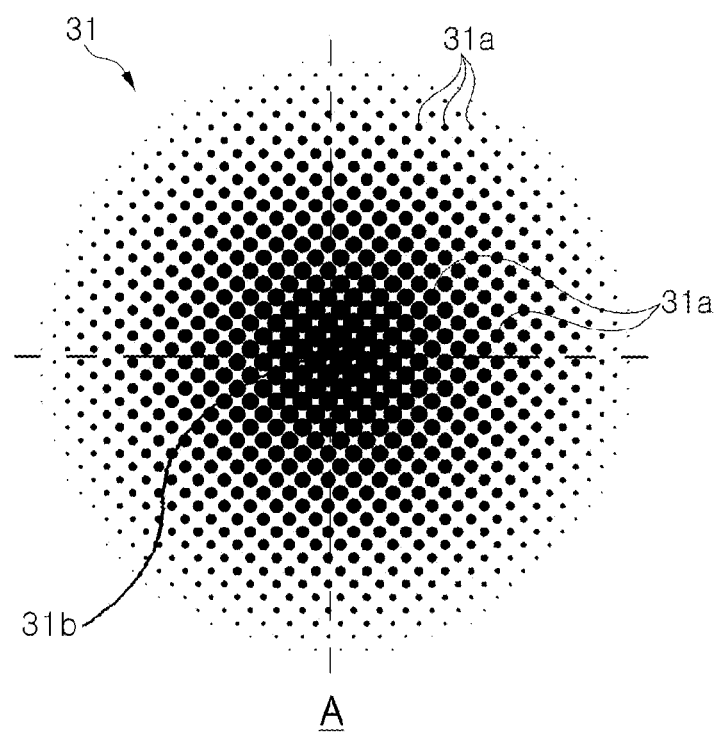
FIGS. 4A and 4B are plan views schematically illustrating patterns according to some example embodiments of the present inventive concepts.

FIG. 4A schematically illustrates an example of the pattern 31 illustrated in portion A of FIG. 3. FIG. 4A is a schematic plan view of a pattern according to some example embodiments of the present inventive concepts.

With reference to FIG. 4A, the pattern 31 may include a radial pattern of dots 31a that has a structure in which a plurality of dots 31a including a reflecting material are radially arranged. The plurality of dots 31a may be gathered to form the pattern 31.

The plurality of dots 31a may have different sizes according to regions in which the dots 31a are located. In detail, based on a center of the recess portion 20a, the plurality of dots 31a may have sizes reduced away from the center of the recess portion 20a, such that the dots 31a have respective sizes that are inversely proportional to distances of the respective dots from the recess portion 20a. For example, in the example embodiments illustrated in FIG. 4A, the pattern 31 is aligned with a central Z axis of a recess portion 20a of a light guide plate 20, such that the center 31b of the pattern 31 is vertically aligned with a center of the recess portion. The dots 31a are arranged in a radial pattern in relation to the center 31b of the pattern 31. A size of the dots 31a proximate to the center 31b of the pattern 31, vertically aligned with the center of a recess pattern 20a and further vertically aligned with a light source 10b, may be greatest, and sizes of the dots 31a may be reduced toward an edge of the pattern 31. Thus, the size of the dots 31a arranged on an edge of the pattern 31 may be smallest, and the respective sizes of the dots 31a in the pattern 31 are inversely proportional to the respective distances of the dots 31a from the center 31b.

In addition, intervals between a plurality of the dots 31a may be increased from a center of the pattern 31 toward an edge thereof, such that a magnitude of an interval between adjacent dots in the radial pattern 31 of dots 31a is proportional to a distance of the adjacent dots 31a from the recess portion 20a. For example, the intervals between the dots 31a may be increased away from the center 31b of the pattern 31, where the center 31b is aligned vertically with a center of the recess portion 20a on which the pattern 31 is located.

Thus, the pattern 31 may have a structure in which the plurality of dots 31a are arranged at a relatively highest density proximate to a center 31b of the pattern 31 and are arranged at a reduced density toward an edge of the pattern 31. As a result, a density of dots 31a in the pattern 31 may be inversely proportional to a distance of the dots 31a from the center 31b of the pattern 31.

The example embodiments shown in FIG. 4A illustrates that respective dots 31a may have a circular shape, but is not limited thereto. For example, the dot 31a may have various shapes such as a quadrangular shape, a hexagonal shape, an octagonal shape, and the like.

As a reflective material forming (e.g., at least partially comprising) the dot 31a, for example, the material may include one or more selected from a group consisting of $SiO_2$, $TiO_2$ and $Al_2O_3$. In addition, the material may include a metal such as aluminum (Al).

The pattern 31 formed by the plurality of arranged dots 31a may be disposed to correspond to positions of the light source 10 and the recess portion 20a, to sufficiently cover the recess portion 20a. For example, a pattern 31 may be vertically aligned with a corresponding recess portion 20a and light source 10b (e.g., a common Z-axis may extend through each of the respective centers of a pattern 31, recess portion 20a, and light source 10b). The pattern 31 partially reflects light emitted by the light source 10b, not having been reflected by the recess portion 20a to be reflected toward an upper portion of the light guide plate 20 as it is, in such a manner that the partially reflected light is re-incident to an interior of the light guide plate 20.

The light having been reflected by the pattern 31 and having been re-incident into the light guide plate 20 may be re-reflected from the first surface 21, a lower surface of the light guide plate 20, to then be externally emitted through the second surface 22.

The light from the light source 10b may be externally emitted through the light guide plate 20 in a form of light from a surface light source. In the example embodiment, by disposing the pattern 31 above the light source 10b, light may be limited and/or prevented from being concentrated on the upper portion of the light source 10b and from causing the occurrence of hot spots.

In detail, in some example embodiments, the plurality of dots 31a forming the pattern 31 may have different sizes and may be arranged to have different intervals therebetween. The plurality of dots 31a may be arranged at a relatively high density in a region of the pattern directly above a light source 10b and may be arranged at a reduced density of dots 31a toward an edge of the pattern 31. Thus, light may be partially transmitted through the pattern 31 and partially reflected therefrom, in such a manner that light transmissivity is relatively low in a central portion of the pattern and is increased on an edge thereof, to thus improve uniformity of brightness distribution.

Figure 4B:
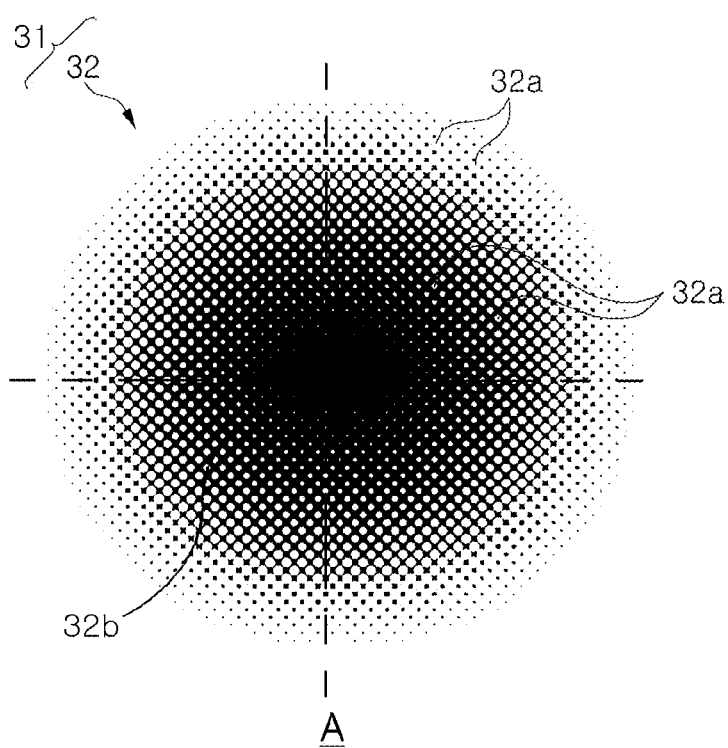

FIG. 4B schematically illustrates another example of the pattern 31 illustrated in portion A of FIG. 3. FIG. 4B is a schematic plan view of a pattern according to some example embodiments of the present inventive concepts.

With reference to FIG. 4B, a pattern 31 may include a radial pattern 32 of holes 32a that has a structure in which a plurality of holes 32a allowing at least a portion of an upper surface of the light guide plate 20 to be exposed are radially arranged. In detail, the pattern 32 may include a plurality of holes 32a arranged in a radial form.

The plurality of holes 32a may have different diameters according to regions of the pattern 32 in which the holes 32a are located. In detail, based on a center of the recess portion 20a, the plurality of holes 32a may have diameters increased away from the center of the recess portion 20a, such that the holes 32a have respective sizes that are proportional to distances of the respective holes from the recess portion 20a. For example, in the example embodiments illustrated in FIG. 4B, the pattern 31 is aligned with a central Z axis of a recess portion 20a of a light guide plate 20, such that the center 32b of the pattern 31 is vertically aligned with a center of the recess portion. The holes 32a are arranged in a radial pattern in relation to the center 32b of the pattern 31. A diameter of the holes 32a proximate to the center 32b of the pattern 32, vertically aligned with the center of a recess pattern 20a and further vertically aligned with a light source 10b, may be smallest, and may be increased toward an edge of the pattern 32. Thus, diameters of the holes 32a arranged on an edge of the pattern 32 may be greatest, and the respective sizes of the holes 32a in the pattern 31 are proportional to the respective distances of the holes 32a from the center 32b.

In addition, intervals between the plurality of holes 32a may be reduced away from a center of the pattern 32, toward an edge thereof, for example, away from the recess portion 20a, such that a magnitude of an interval between adjacent holes in the radial pattern 32 of holes 32a is inversely proportional to a distance of the adjacent holes 32a from the recess portion 20a.

Thus, the pattern 32 may have a structure in which the plurality of holes 32a are arranged at a lowest density proximate to a center 32b of the pattern 32 and are arranged at an increased density toward an edge of the pattern 32. As a result, a density of holes 32a in the pattern 32 may be proportional to a distance of the holes 32a from the center 32b of the pattern 32.

The example embodiments shown in FIG. 4B illustrates that each hole 32a may have a circular shape, but is not limited thereto. For example, the hole 32a may have various cross sectional shapes such as a quadrangular cross section, a hexagonal cross section, an octagonal cross section, and the like.

In a manner different from the pattern 31 according to the foregoing example embodiment of FIG. 4A, in the example embodiment of FIG. 4B, the plurality of holes 32a forming the pattern 32 may have different diameters and be arranged to have different intervals therebetween, while being arranged at a relatively low density on a region of the pattern, directly above the light source 10, and being arranged at a relatively high density toward an edge of the pattern. Thus, light may be partially transmitted through the pattern 32 and partially reflected, in such a manner that light transmissivity is relatively low on a central portion of the pattern and is increased on an edge portion of the pattern 32, to thus improve uniformity of brightness distribution.

Figure 5A:
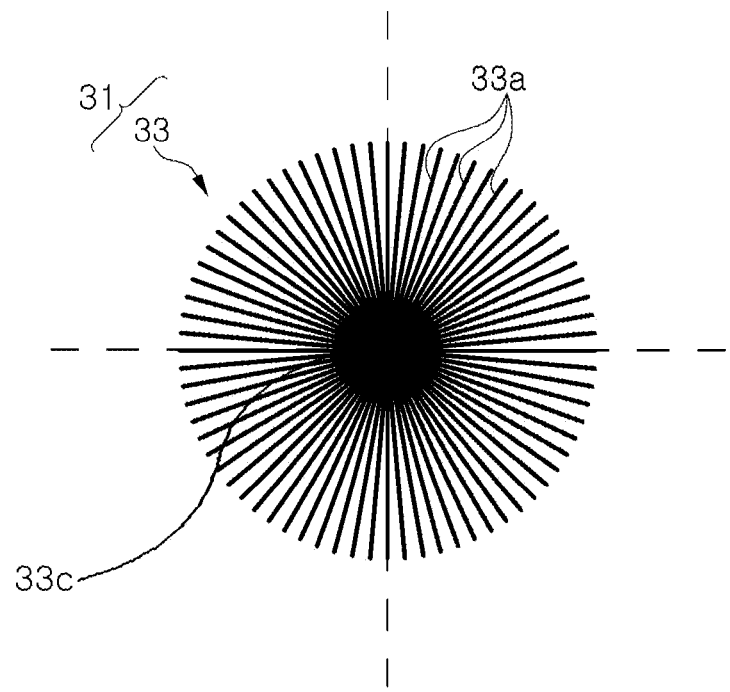
FIGS. 5A and 5B are plan views schematically illustrating patterns according to some example embodiments of the present inventive concepts.
Figure 5B:
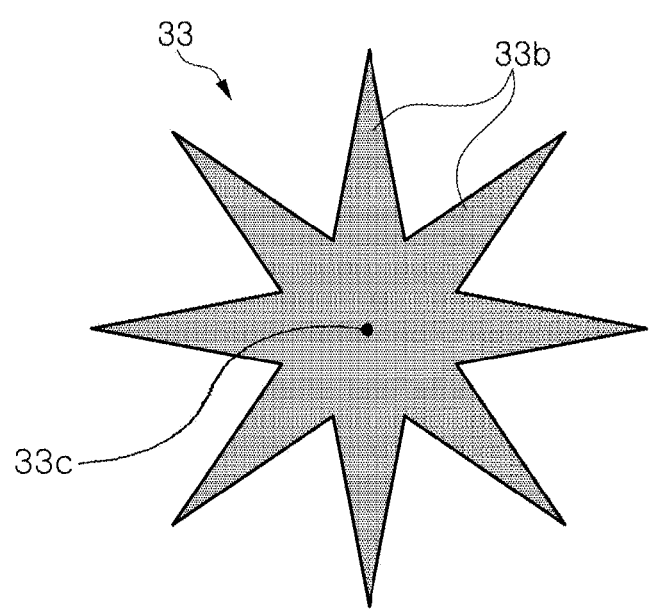

FIGS. 5A and 5B schematically illustrate one or more example embodiments of the pattern 31 as shown in FIG. 3.

With reference to FIGS. 5A and 5B, a pattern 31 may include a pattern 33 that may have a star-shaped structure in which a plurality of rod-shaped branches 33a formed of (e.g., at least partially comprising) a reflective material are extended in radial form from a center 33c of the pattern 33. The branches 33a may have a linear shape. In addition, as illustrated in FIG. 5B, the branches 33b may have a triangular shape.

Figure 6:
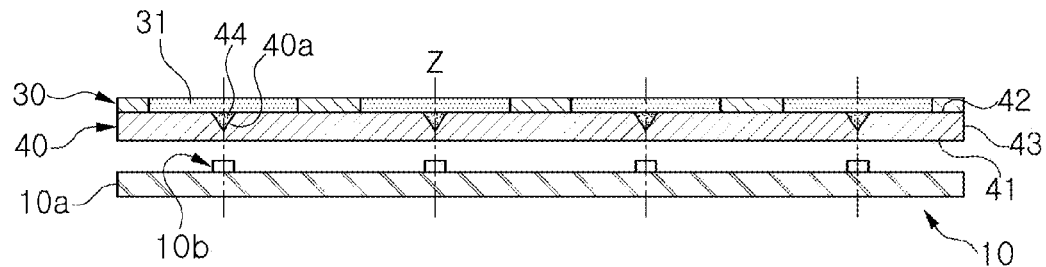
FIG. 6 is a schematic cross-sectional view of a light source module according to some example embodiments of the present inventive concepts.

With reference to FIG. 6, a light source module according to some example embodiments will be described. FIG. 6 is a schematic cross-sectional view of a light source module according to some example embodiments.

With reference to FIG. 6, a light source module 2 according to some example embodiments may include a light source 10, a light guide plate 40 disposed on the light source 10, and a filter sheet 30 attached to an upper surface of the light guide plate 40.

The light source module 2 according to some example embodiments illustrated with reference to FIG. 6 may have a configuration substantially identical to that of the light source module 1 according to the example embodiment with reference to FIGS. 1 to 5. However, since the example embodiment of FIG. 6 has a difference from the foregoing example embodiment described above with reference to FIGS. 1 to 5 in that the light guide plate 40 includes a light diffusion portion 44, a description overlapping with the description of the foregoing example embodiment will be omitted and differences therebetween will be described below.

With reference to FIG. 6, the light guide plate 40 may include a first surface 41 facing (e.g., proximate to) the light source 10b, a second surface 42 opposing the first surface 41 (e.g., distal from the light source 10b), and a third surface 43 disposed between the first surface 41 and the second surface 42.

The first surface 41 may be a bottom surface of the light guide plate 40. Light emitted from the light source 10b may be transmitted to an interior of the light guide plate 40 through the first surface 41. The second surface 42 may be an upper surface of the light guide plate 40. The light having been transmitted into the light guide plate 40 may be externally emitted through the second surface 42. The third surface 43 may be a lateral surface of the light guide plate 40. The third surface 43 may connect an edge of the first surface 41 and an edge of the second surface 42 to each other.

The light guide plate 40 may have a recess portion 40a formed in the second surface 42, an upper surface thereof. The recess portion 40a may have a structure recessed into the second surface 42, toward the light source 10, to a desired (and/or alternatively predetermined) depth. The recess portion 40a may be disposed to oppose the light source layer 10. A vertex of a recess portion 40a recessed toward the light source layer 10 may be disposed on an axis Z of a light source 10b.

The light guide plate 40 may include a light diffusion portion 44 filling the recess portion 40a. The light diffusion portion 44 may include one or more selected from a group consisting of $SiO_2$, $TiO_2$ and $Al_2O_3$, as a light diffusion material, added to a resin having light transmitting characteristics.

As the light diffusion portion 44 is provided in a manner filling the recess portion 40a, the light guide plate 40 may have a structure in which the second surface 42 is flat in a similar manner to the first surface 41.

The light diffusion portion 44 may reflect and distribute light, not having been reflected from an interface between the light diffusion portion 44 and the recess portion 40a to be refracted and thus having been transmitted into the light diffusion portion 44, such that the light may be re-diffused to an interior of the light guide plate 40. Thus, compared to a structure in which the recess portion 40a is empty, in the structure in which the recess portion 40a is filled with, for example, the light diffusion portion, light from the light source 10b may be diffused to the interior of the light guide plate 40 in a relatively wider region thereof.

Figure 7:
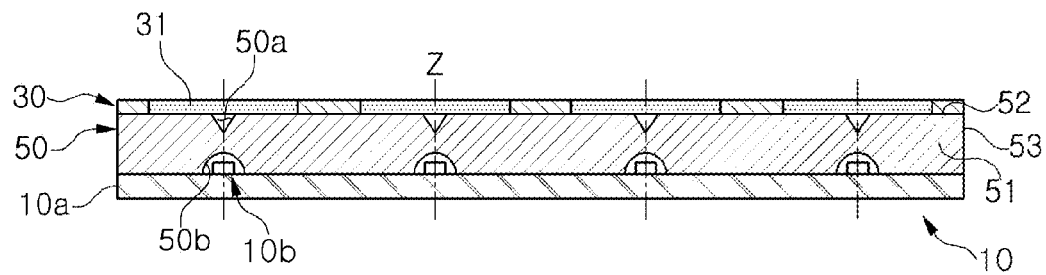
FIG. 7 is a schematic cross-sectional view of a light source module according to some example embodiments of the present inventive concepts.

With reference to FIG. 7, a light source module according to some example embodiments will be described. FIG. 7 is a schematic cross-sectional view of a light source module according to some example embodiments.

With reference to FIG. 7, a light source module 3 according to some example embodiments may include a light source layer 10, a light guide plate 50 disposed on the light source layer 10, and a filter sheet 30 attached to an upper surface of the light guide plate 50.

The light source module 3 according to some example embodiments illustrated with reference to FIG. 7 has a configuration substantially identical to that of the light source module 1 according to the foregoing example embodiment with reference to FIGS. 1 to 5. However, since some example embodiments of FIG. 7 has a difference from the foregoing example embodiment with reference to FIGS. 1 to 5 in that the light guide plate 50 includes a receiving recess 50b, a description overlapping with the description of the foregoing example embodiment will be omitted and differences therebetween will be described below.

With reference to FIG. 7, the light guide plate 50 may include a first surface 51, a second surface 52 opposing the first surface 51, and a third surface 53 disposed between the first surface 51 and the second surface 52.

The first surface 51 may be a bottom surface of the light guide plate 50. Light from the light sources 10b may be transmitted to an interior of the light guide plate 50 through the first surface 51. The second surface 52 may be an upper surface of the light guide plate 50. The light having been transmitted into the light guide plate 50 may be externally emitted through the second surface 52. The third surface 53 may be a lateral surface of the light guide plate 50. The third surface 53 may connect an edge of the first surface 51 and an edge of the second surface 52 to each other.

The light guide plate 50 may have a recess portion 50a formed in the second surface 52, an upper surface thereof. The recess portion 50a may have a structure recessed into the second surface 52, toward the light source layer 10, to a desired (and/or alternatively predetermined) depth. The recess portion 50a may be disposed to oppose the light source layer 10. A vertex of a recess portion 50a recessed toward the light source layer 10 may be disposed on an axis Z of a light source 10b.

The light guide plate 50 may have a receiving recess 50b formed in the first surface 51, a lower surface of the light guide plate 50. The receiving recess 50b may have a structure recessed into the first surface 51, toward the second surface 52, to a desired (and/or alternatively predetermined) depth. The receiving recess 50b may be disposed to oppose the recess portion 50a, and may accommodate a light source 10b therein.

The receiving recess 50b may have a semicircular or a semielliptical dome shape, and may have a size able to accommodate the light source 10b therein. A surface of the receiving recess 50b may be defined as an incident surface on which light from the light source 10b is transmitted to an interior of the light guide plate 50.

As described above, as the receiving recess 50b has a dome shape, light transmitted to the interior of the light guide plate 50 may be diffused to a relatively wide region of the light guide plate 50.

Various types of light sources 10b may be employed in the light source module 1 according to the example embodiment. As the light source 10b, a light emitting diode (LED) chip having various structures or a light emitting diode package in which the light emitting diode chip is employed may be used.

Figure 8:
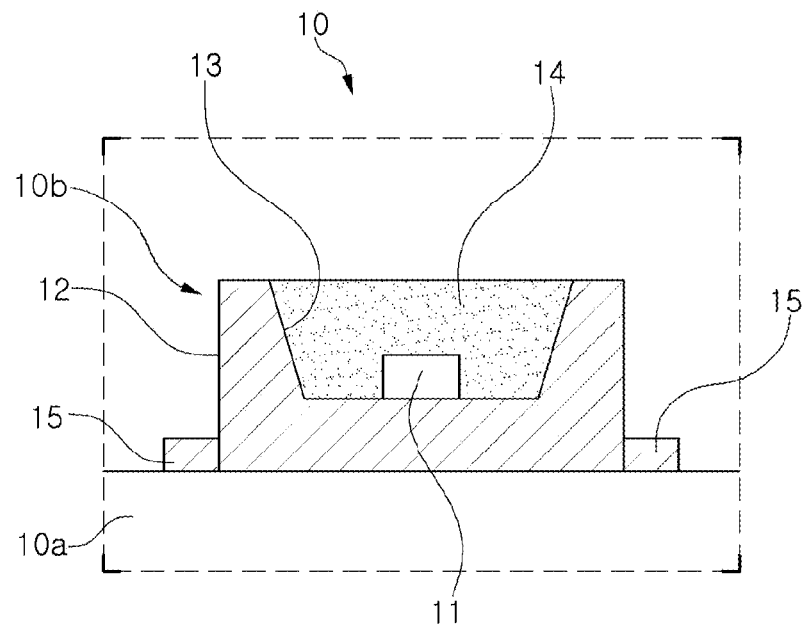
FIG. 8 is a schematic cross-sectional view of a light source according to some example embodiments of the present inventive concepts.

FIG. 8 schematically illustrates a light source layer 10 according to some example embodiments of the present inventive concepts. As illustrated in FIG. 8, a light source 10b may have, for example, a package structure in which an LED chip 11 is mounted in a package body 12 having a reflective cup 13. The LED chip 11 may be covered by an encapsulation portion 14 containing a phosphor.

The package body 12 may be a base member on which the LED chip 11 is mounted and supported thereby, and may be formed of a white molding compound having relatively high light reflectivity. The use of such white molding compound having relatively high light reflectivity provides an effect of reflecting light emitted from the LED chip 11 to increase an amount of light emitted externally. Such a white molding compound may include a thermosetting resin-based material having high heat resistance or a silicon resin-based material. In addition, a white pigment and a filling material, a hardener, a releasing agent, an antioxidant, an adhesion improver, or the like may be added to a thermoplastic resin-based material. In addition, the package body 12 may be formed of FR-4, CEM-3, an epoxy material, a ceramic material, or the like. Further, the package body 12 may be formed using a metal such as aluminum (Al).

The package body 12 may be provided with a lead frame 15 disposed thereon, for an electrical connection thereof to external power. The lead frame 15 may be formed using a material having excellent electrical conductivity, for example, a metal such as aluminum, copper, or the like. For example, when the package body 12 is formed of a metal, an insulating material may be interposed between the package body 12 and the lead frame 15.

In the case of the reflective cup 13 provided in the package body 12, the lead frame 15 may be exposed to a bottom surface of the reflective cup 13 on which the LED chip 11 is mounted. The LED chip 11 may be electrically connected to the exposed lead frame 15.

In the case of the reflective cup 13, an area of an upper portion thereof exposed to an upper part of the package body 12 is greater than that of a bottom surface of the reflective cup 13. The area of the upper portion of the reflective cup 13 exposed to the upper part of the package body 12 may be defined as a light emission surface of the light source 10b.

The LED chip 11 may be sealed by the encapsulation portion 14 formed in the reflective cup 13 of the package body 12. The encapsulation portion 14 may contain a wavelength conversion material.

Figure 9A:
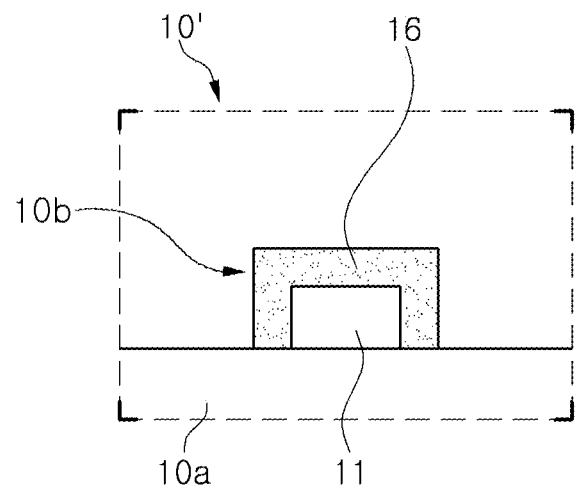
FIGS. 9A and 9B are schematic cross-sectional views of light sources according to some example embodiments of the present inventive concepts.
Figure 9B:
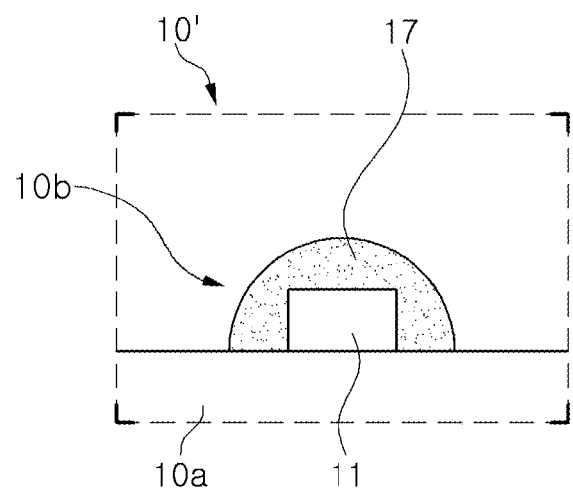

FIGS. 9A and 9B are schematic cross-sectional views of a light source 10' according to some example embodiments of the present inventive concepts.

As illustrated in FIG. 9A, the light source layer 10' may include a light source 10b that may have a phosphor-on-chip (POC) structure in which the LED chip 11 is encapsulated by a wavelength conversion layer 16. The entirety of the wavelength conversion layer 16 may have a uniform thickness and may cover the LED chip 11. In addition, as illustrated in FIG. 9B, a wavelength conversion layer 17 may encapsulate the LED chip 11 in a dome form.

As such, for example, when the light source 10b has the POC structure, the light source 10b may have characteristics of relatively wide angle of beam spread in light, as compared to the package structure illustrated in FIG. 8.

The LED chip 11 may be mounted on the substrate 10a in a flip-chip bonding method using a bonding member such as solder.

The wavelength conversion layer 16 or 17 may encapsulate the entirety of the LED chip 11 to cover an upper surface and a lateral surface of the LED chip 11 in an integrated manner. The wavelength conversion layers 16 and 17 may include, for example, a resin having light transmitting characteristics and a wavelength conversion material contained in the resin.

Figure 10:
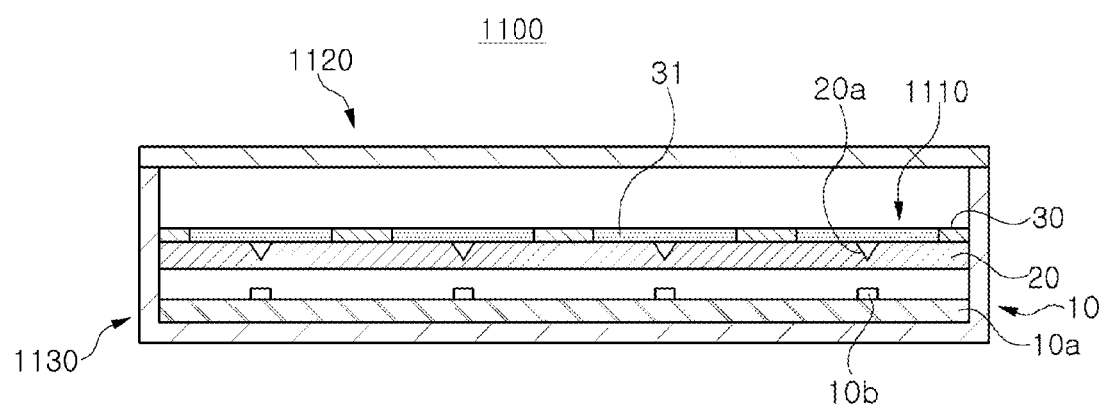
FIG. 10 is a schematic cross-sectional view of a lighting apparatus in which a light source module according to some example embodiments may be employed.

With reference to FIG. 10, a lighting apparatus according to some example embodiments will be described. FIG. 10 is a schematic cross-sectional view of a lighting apparatus in which a light source module according to some example embodiments may be employed.

With reference to FIG. 10, a lighting apparatus 1100 according to some example embodiments may include a light source module 1110 and a cover 1120 disposed above the light source module 1110. The lighting apparatus 1100 may further include a housing 1130 accommodating the light source module 1110 therein.

In the example embodiment, the light source module 1110 may have a configuration and structure similar to those of the light source module 1 according to the example embodiment illustrated with reference to FIG. 1. A detailed description with respect to respective constituent elements of the light source module 1110 will be substituted with the description of the foregoing example embodiment with reference to FIG. 1, and thus, can be understood therefrom.

The cover 1120 may be disposed above the light guide plate 20 to be separated from the light guide plate 20 to which the filter sheet 30 has been attached, and may cover the light guide plate 20. In order to implement slimming of the lighting apparatus 1100, the cover 1120 may be disposed to have an interval of about 10 mm from the substrate 10a of the light source module 1110.

The cover 1120 may serve as a type of diffuser, through which light from the light source layer 10, penetrating through the cover 1120 may be sufficiently distributed to be irradiated externally. Thus, surface light emissions having entirely uniform brightness distribution may be implemented.

The cover 1120 may be formed of a resin material having light transmitting characteristics, and for example, may include polycarbonate (PC), polymethyl methacrylate (PMMA), acryl, or the like.

The cover 1120 may contain a light dispersion material within a range of about 3% to about 15%. As the light dispersion material, one or more selected from a group consisting of, for example, $SiO_2$, $TiO_2$ and $Al_2O_3$ may be used. In a case in which the light dispersion material is contained in a content of less than 3%, light may not be sufficiently distributed such that light dispersion effects may not be expected. In addition, in a case in which the light dispersion material is contained in a content of more than 15%, an amount of light emitted outwardly from the cover 1120 may be reduced, thus deteriorating light extraction efficiency.

The light dispersion material may be selectively contained, or may be omitted according to some example embodiments. In addition, a fine concave-convex structure may be formed on a surface of the cover 1120.

The housing 1130 may accommodate the light source module 1110 therein, and may protect the light source module 1110 from an external environment.

The housing 1130 may perform a function of a frame supporting the light source module 1110 and a function of a heat sink externally discharging heat generated by the light source module 1110. To this end, the housing 1130 may be formed of a solid material having relatively high heat conductivity, and for example, may be formed of a metal such as aluminum (Al), a heat radiating resin, or the like.

In the case of the lighting apparatus 1100 according to the example embodiment, an optical design thereof may be changed according to a product type, a location and the purpose of the product, and the like. For example, the lighting apparatus 1100 according to the example embodiment may be used as a backlight unit (BLU) of a display of a TV, a monitor, or the like, or may be used as a lighting device such as a flat lighting device, an indirect lighting device, or the like, irradiating a relatively wide region with light. The lighting apparatus 1100 may be applied to an automobile tail lamp, a daytime running light (DRL), and the like. In detail, for example, in the case of a curved display, having a curved design rather than a simple flat design, a design thereof may be easily performed to be suitable for a curved shape. Thus, the lighting apparatus may be adaptively used as a light source having various designs.

In addition, with the lighting apparatus 1100 according to the example embodiment, a visible light communications technology for simultaneously attaining a peculiar purpose of an LED and a purpose of a communications means may be carried out by adding a communications function thereto. In detail, LEDs have positive characteristics such as a long lifespan, excellent power efficiency, and implementation of various colors, as compared to existing light sources, as well as having a rapid switching rate and digital controlling for digital communications.

The visible light communications technology may be a wireless communications technology for transferring information in a wireless manner using light within a visible light wavelength band, perceptible to the human eye. The visible light communications technology is discriminated from an existing wired optical communications technology and infrared wireless communications, in terms of using light in a visible light wavelength band, and is discriminated from a wired optical communications technology in that a communications environment thereof is wireless.

Further, the visible light communications technology may provide convenience in that it may be freely used without regulations or permission in terms of using a radio frequency and discrimination that physical security is prominent and communications links may be confirmed visually by a user, in a manner different from radio frequency (RF) wireless communications. Furthermore, the visible light communications technology has convergence technology characteristics, by which a unique purpose of a light source and a communications function may be simultaneously obtained.

Figure 11:
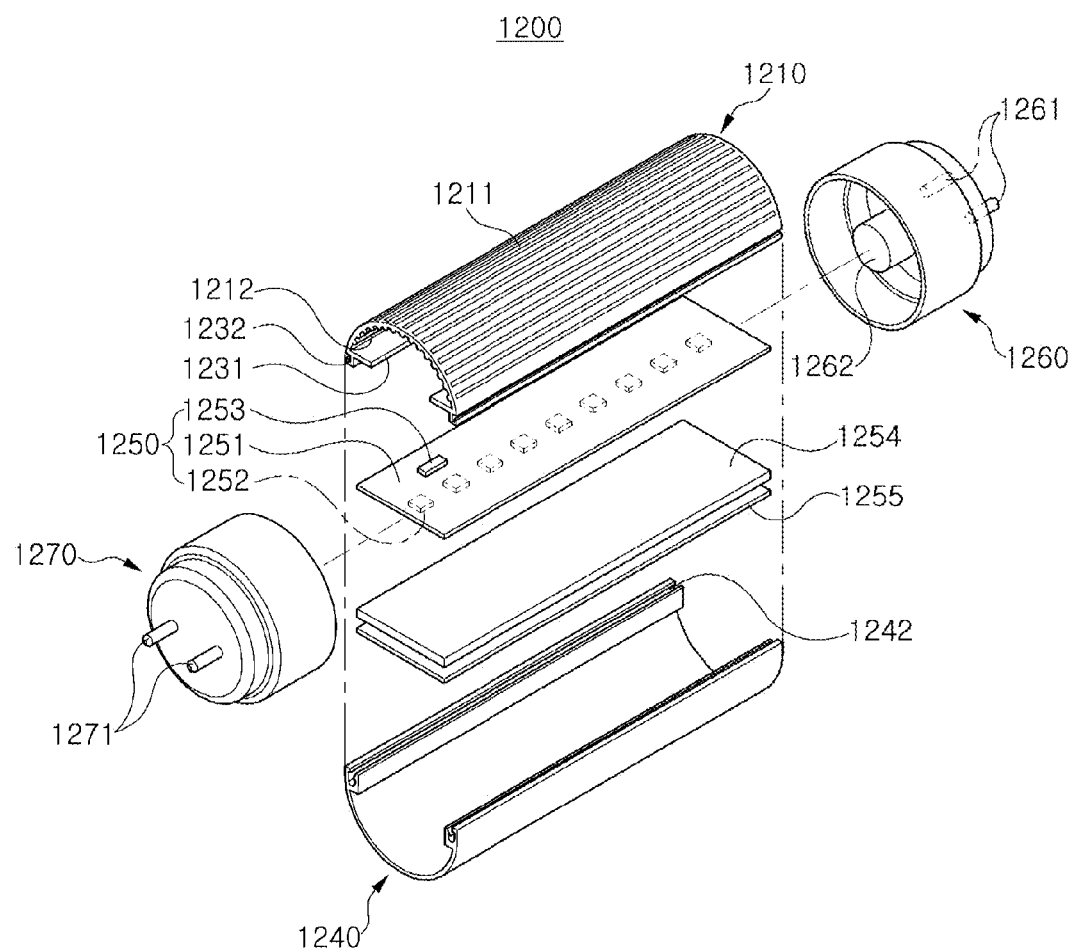
FIG. 11 is an exploded perspective view of a bar-type lamp in which a light source module according to some example embodiments may be employed.

FIG. 11 is an exploded perspective view of a bar-type lamp in which a light source module according to some example embodiments may be employed.

With reference to FIG. 11, a lighting apparatus 1200 may include a heat sink 1210, a cover 1240, a light source module 1250, a first socket 1260, and a second socket 1270.

A plurality of heat radiating fins 1211 and 1212 having a concave-convex form may be formed on an inner surface or/and an external surface of the heat sink 1210. The heat radiating fins 1211 and 1212 may be designed to have various forms and intervals therebetween.

A support portion 1231 having a protrusion form may be formed on an inner side of the heat sink 1210. The light source module 1250 may be fixed to the support portion 1231. A stop protrusion 1232 may be formed on two ends of the heat sink 1210.

A stop recess 1242 may be formed in the cover 1240. The stop recess 1242 may be coupled to the stop protrusion 1232 of the heat sink 1210 in a hook coupling manner. Positions in which the stop recess 1242 and the stop protrusion 1232 are formed may also be inversely changed.

The light source module 1250 may include a printed circuit board 1251, a plurality of light sources 1252, a controller 1253, and a light guide plate 1254 to which a filter sheet 1255 is attached. The controller 1253 may store driving information of the plurality of light source 1252 therein. Circuit wires for operating the plurality of light sources 1252 may be disposed in the printed circuit board 1251. In addition, the printed circuit board 1251 may also include constituent elements for operating the plurality of light sources 1252.

The light guide plate 1254 may be disposed on the plurality of light sources 1252. The light guide plate 1254 may have a plurality of recess portions (not shown) in an upper surface thereof. The filter sheet 1255 on which a plurality of patterns have been formed may be attached to an upper surface of the light guide plate 1254.

In the example embodiment, the light source module 1250 may have a configuration and structure similar to those of the light source module 1 according to the example embodiment illustrated with reference to FIG. 1. A detailed description with respect to respective constituent elements of the light source module 1250 will be substituted with the description of the foregoing example embodiment with reference to FIG. 1, and thus, can be understood therefrom.

The first and second sockets 1260 and 1270 may be provided as a pair of sockets, and may have a structure in which they are coupled to two ends of a cylindrical cover unit configured of the heat sink 1210 and the cover 1240. For example, the first socket 1260 may include electrode terminals 1261 and a power supply device 1262, and the second socket 1270 may include dummy terminals 1271 disposed thereon. In addition, an optical sensor and/or a communications module may be disposed inside one of the first socket 1260 or the second socket 1270. For example, the optical sensor and/or the communications module may be embedded in the second socket 1270 on which the dummy terminals 1271 are disposed. In another example, an optical sensor and/or a communications module may be embedded in the first socket 1260 on which the electrode terminals 1261 are disposed.

According to some example embodiments of the present inventive concepts, an Internet of Things (IoT) device has an accessible wired or wireless interface, may be in communication with one or more other devices through a wired/wireless interface, and may include devices for transmitting or receiving data. The accessible interface may include a wired local area network (LAN), a wireless local area network (WLAN) such as wireless fidelity (Wi-Fi), wireless personal area network (WPAN) such as Bluetooth, wireless universal serial bus (wireless USB), Zigbee®, near field communications (NFC), radio-frequency identification (RFID), power line communications (PLC), a modem communications interface accessible to a mobile communications network (mobile cellular network) such as a 3rd generation (3G) network, a 4th Generation (4G) network, a long term evolution (LTE) network, or the like. The Bluetooth interface may support Bluetooth low energy (BLE).

As set forth above, according to some example embodiments of the present inventive concepts, a light source module in which the occurrence of nonuniform areas of brightness such as hot spots may be limited and/or prevented while allowing for the slimming of a lighting apparatus, and a lighting apparatus including the same, are provided.

While example embodiments have been shown and described above, it will be apparent to those skilled in the art that modifications and variations can be made without departing from the scope of the present inventive concepts as defined by the appended claims.

What is claimed is:

1. A light source module, comprising:
a light source;
a light guide plate on the light source, the light guide plate including an upper surface, the light guide plate including a recess portion in the upper surface of the light guide plate; and
a filter sheet attached to the upper surface of the light guide plate, the filter sheet including a pattern configured to partially reflect and partially transmit light emitted from the light source through the light guide plate.

2. The light source module of claim 1, wherein,
the filter sheet is attached to the upper surface of the light guide plate such that the pattern of the filter sheet covers the recess portion of the light guide plate, and
the pattern of the filter sheet includes a radial pattern of dots, each dot of the pattern of dots including a reflective material.

3. The light source module of claim 2, wherein the pattern of dots includes dots having different sizes depending on regions in which the dots are located in the pattern.

4. The light source module of claim 2, wherein the radial pattern of dots on the recess portion includes dots having sizes that are inversely proportional to distances of the dots from a center of the radial pattern.

5. The light source module of claim 2, wherein a magnitude of an interval between adjacent dots in the radial pattern of dots is proportional to a distance of the adjacent dots from a center of the radial pattern.

6. The light source module of claim 1, wherein,
the pattern of the filter sheet covers the recess portion of the light guide plate, and
the pattern of the filter sheet includes a radial pattern of holes, each hole of the pattern of holes configured to expose at least a portion of the upper surface of the light guide plate.

7. The light source module of claim 6, wherein the radial pattern of holes on the recess portion includes holes having diameters that are proportional to distances of the holes from a center of the radial pattern.

8. The light source module of claim 6, wherein a magnitude of an interval between adjacent holes in the radial pattern of holes is inversely proportional to a distance of the adjacent dots from a center of the radial pattern.

9. The light source module of claim 1, wherein the recess portion is configured to oppose the light source.

10. The light source module of claim 9, wherein,
a vertex of the recess portion is recessed toward the light source, and
the vertex of the recess portion is aligned with an axis of the light source.

11. The light source module of claim 1, further comprising:
a light diffusion portion at least partially filling the recess portion.

12. The light source module of claim 11, wherein the light diffusion portion includes at least one of $SiO_2$, $TiO_2$ and $Al_2O_3$.

13. The light source module of claim 1, wherein the light guide plate further includes a receiving recess, the receiving recess being recessed into a lower surface of the light guide plate, such that the receiving recess accommodates the light source.

14. The light source module of claim 1, wherein the light source includes a semiconductor light emitting diode (LED) chip or an LED package in which an LED chip is mounted.

15. A lighting apparatus, comprising:
a light source module, the light source module including,
a light source,
a light guide plate on the light source and including a recess portion in an upper surface of the light guide plate, and
a filter sheet attached to the upper surface of the light guide plate and including a pattern configured to partially reflect and partially transmit light emitted from the light source through the light guide plate; and
a cover on the light source module.

16. The lighting apparatus of claim 15, further comprising:
a housing accommodating the light source module.

17. An apparatus, comprising:
a plurality of light sources;
a light guide plate on the plurality of light sources, the light guide plate including,
a first surface proximate to the plurality of light sources,
a second surface distal to the plurality of light sources, and
a third surface between the first surface and the second surface,
wherein the light guide plate includes a plurality of recess portions recessed into the second surface, the recess portions vertically aligned with separate, respective light sources of the plurality of light sources; and
a filter sheet on the second surface of the light guide plate, the filter sheet including a plurality of patterns vertically aligned with separate, respective recess portions of the light guide plate, each pattern of the plurality of patterns including one of,
a radial pattern of dots, each dot of the radial pattern of dots including a reflective material, and a radial pattern of holes, each hole of the radial pattern of holes configured to expose at least a portion of the second surface of the light guide plate.

18. The apparatus of claim 17, wherein each given recess portion includes,
a vertex that is recessed toward a separate light source of the plurality of light sources, and
the vertex of the given recess portion is aligned with an axis of the separate light source.

19. The apparatus of claim 17, further comprising:
a light diffusion portion at least partially filling at least one recess portion of the plurality of recess portions.

20. The apparatus of claim 19, wherein the light diffusion portion includes at least one of $SiO_2$, $TiO_2$ and $Al_2O_3$.

* * * * *